(12) United States Patent
Asada

(10) Patent No.: US 7,327,203 B2
(45) Date of Patent: Feb. 5, 2008

(54) PWM SIGNAL GENERATION CIRCUIT AND PWM CONTROL CIRCUIT

(75) Inventor: Kazuhiro Asada, Yokkaichi (JP)

(73) Assignees: Autonetworks Technologies, Ltd., Mie (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 142 days.

(21) Appl. No.: 11/268,495

(22) Filed: Nov. 8, 2005

(65) Prior Publication Data

US 2006/0097765 A1 May 11, 2006

(30) Foreign Application Priority Data

Nov. 10, 2004 (JP) .............................. 2004-326363

(51) Int. Cl.
  *H03K 7/08* (2006.01)
  *G05F 5/00* (2006.01)
(52) U.S. Cl. ...................... 332/109; 323/299; 323/303; 323/223; 323/226; 323/317; 315/77; 315/82
(58) Field of Classification Search ................ 363/41, 363/21.1, 21.11, 21.18; 332/109; 323/299, 323/303
  See application file for complete search history.

(56) References Cited

U.S. PATENT DOCUMENTS 4,237,405 A * 12/1980 Kellis ........................ 315/307
5,625,265 A * 4/1997 Vlahu ........................ 318/254
6,650,197 B2 * 11/2003 Sekiya ....................... 332/109
6,958,596 B1 * 10/2005 Sferrazza et al. ........... 323/303
7,038,430 B2 * 5/2006 Itabashi et al. ............. 323/224
2002/0171495 A1 * 11/2002 Hughes ....................... 331/47

FOREIGN PATENT DOCUMENTS

JP        A 7-154965       6/1995

* cited by examiner

*Primary Examiner*—Gary L. Laxton
*Assistant Examiner*—Stuart Hansen
(74) *Attorney, Agent, or Firm*—Oliff & Berridge, PLC

(57) ABSTRACT

A PWM signal generation circuit and a PWM control circuit are provided in which the duty ratio is easily changed and which can also avoid adverse impact from ambient temperature changes and the like. At the beginning of charging a capacitor with a current flow, a voltage level at a connection point between the negative input terminal of a comparator and the capacitor is still below a charging threshold. When the charging threshold is exceeded, the comparator is inverted to a low state and a current flows into an output point of the comparator to start discharging the capacitor. At the beginning of discharging from the capacitor, the voltage level at the connection point is still above the discharging threshold. However, when the voltage level falls below the discharging threshold, the comparator returns to a high state, and the charging operation again takes over.

20 Claims, 4 Drawing Sheets

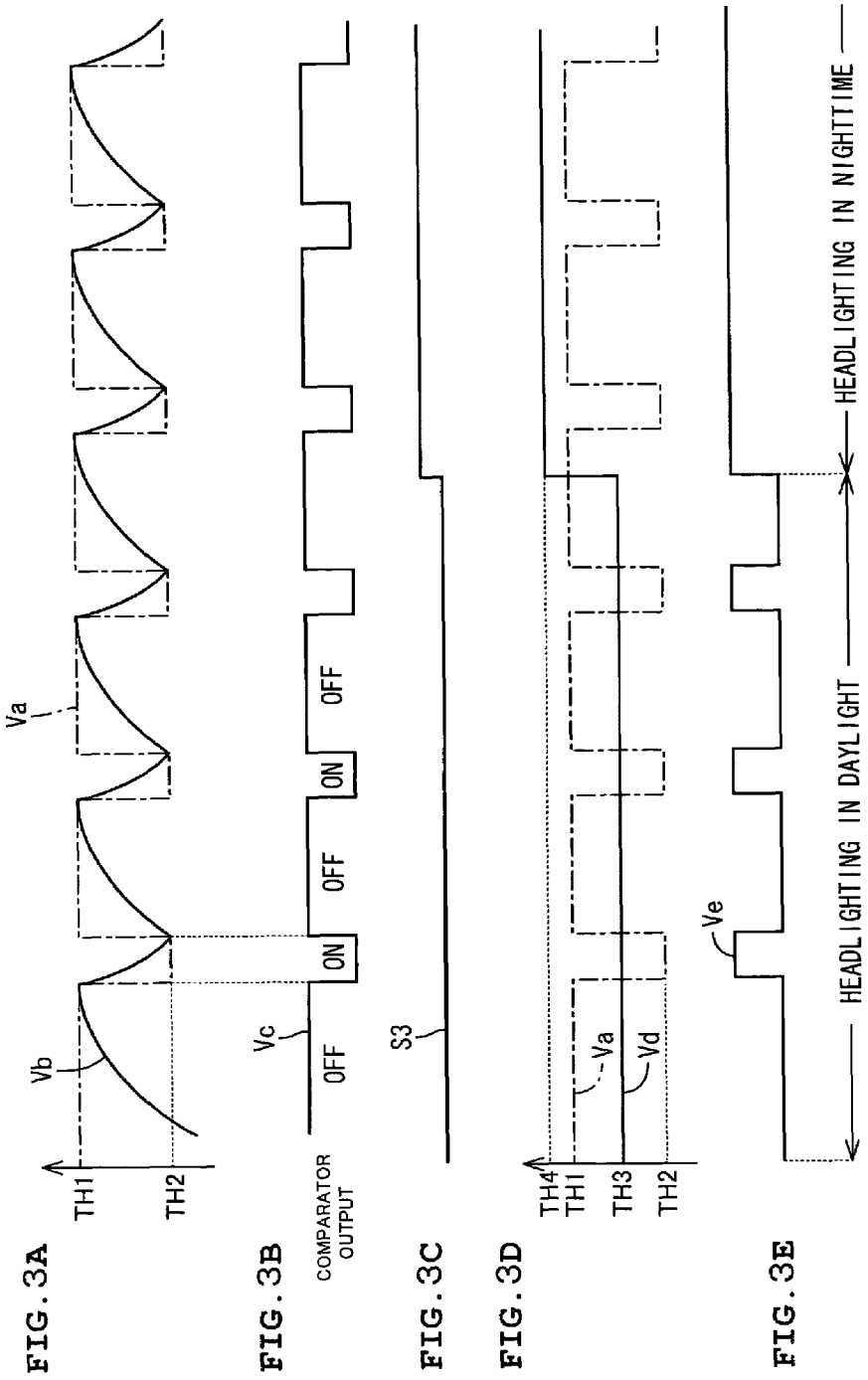

PWM SIGNAL GENERATION CIRCUIT AND PWM CONTROL CIRCUIT

BACKGROUND OF THE INVENTION

1. Field of the Invention

The present invention relates to a Pulse Width Modulation (PWM) signal generation circuit and a PWM control circuit.

2. Description of the Related Art

Each country has its own safety standards, for example, for headlamps of vehicles. According to some safety standards, headlamps are required to be illuminated while driving in broad daylight at a brightness of a predetermined proportion (for example, 12.5% and 22.5%) to that of the nighttime. Therefore, some headlamps are conventionally illuminated with PWM control for headlighting during daylight (Daylights) in a predetermined proportion to headlighting at nighttime. Some arrangements for the PWM control accomplish the lighting control of headlamps based on PWM signals, for example, generated by a microcomputer or a special purpose IC.

Those arrangements for the PWM control with the microcomputer and the like, however, require the voltage of a battery mounted on the vehicle (for example, 12 V) to be converted to a voltage on the order of 5 V before supplying power to the microcomputer, resulting in the need of an arrangement to accomplish this end. In addition, because the reflectance of a reflector surrounding a headlamp is different according to the types, etc., of vehicles on which the headlamp is mounted, headlamps should be arranged so that the duty ratio of the PWM control is adjusted depending on the difference in the reflectance of the reflectors in order to meet the specific safety standard of a country. A PWM control with a microcomputer and the like, however, is programmed to output PWM signals for a predetermined duty ratio. The program itself must be modified in order to change the duty ratio. This poses a problem in that it is labor-intensive and time-consuming to change the duty ratio.

Meanwhile, for example, Japanese Laid-Open Patent No. 7-154965 discloses a PWM control circuit for PWM control with a hardware configuration including an oscillation circuit.

However, the PWM control circuit in Japanese Laid-Open Patent No. 7-154965 has a problem in that, as the circuit constant of a PWM control circuit varies due to changes in the ambient temperature, degradation of circuit elements, and the like, the duty ratio varies accordingly. Such a problem may have a significant impact, particularly on a vehicle etc., which is often used in an environment where the ambient temperature changes drastically.

The present invention has been made in view of the foregoing circumstances. It is an object of the invention to provide a PWM signal generation circuit and a PWM control circuit in which the duty ratio is easily changed and which can avoid a significant adverse impact from ambient temperature changes and the like.

SUMMARY OF THE INVENTION

<The Invention According to a First Aspect and a Second Aspect>

According to an arrangement of a first aspect of the invention, when the output of a comparator is in a high state (i.e., where an open-collector output inside the comparator turns off to output a high level signal), a capacitor is charged from a power line by a current flowing through a second resistor. A voltage depending on the amount of charge is provided to a second input terminal of the comparator. Meanwhile, a voltage level provided to a first input terminal of the comparator (the voltage level is hereinafter referred to as the "charging threshold") is determined by a current flowing through a voltage-dividing circuit and a first resistor.

When the voltage level depending on the amount of charge in the capacitor exceeds the charging threshold, the output of the comparator is brought to low state (i.e., where an open-collector output inside the comparator turns on to output a low level signal). This causes a discharged current from the capacitor to flow into a ground through a second feedback line and the output side of the comparator, which slowly reduces the amount of charge in the capacitor. Along with this, part of a current from the voltage-dividing circuit and a current flowing through the first resistor flow into the ground through the output side of the comparator. Thus, the voltage level provided to the first input terminal of the comparator falls below the charging threshold (this voltage level is hereinafter referred to as the "discharging threshold").

When the voltage level depending on the amount of charge in the capacitor falls below the discharging threshold, the output of the comparator returns to a high level. Then the capacitor is again charged and the charging threshold is provided to the first input terminal of the comparator.

In this way, the waveform of the output signal from the comparator and/or the waveform of the voltage signal from the first input terminal side become a square pulse waveform so that they can be utilized as PWM signals.

In addition, according to an arrangement of claim 2, when a push-pull output of an operational amplifier is in a high state (i.e., where a high-potential side transistor in a push-pull circuit inside the operational amplifier turns on to output a high level signal), a capacitor is charged by a current flowing through a second resistor from a power line. In addition, a voltage depending on the amount of charge is provided to a second input terminal of the operational amplifier. Meanwhile, the voltage level provided to the first input terminal of the operational amplifier (the voltage level is hereinafter referred to as the "charging threshold") is determined by the current flowing through a voltage-dividing circuit.

When the voltage level depending on the amount of charge in the capacitor exceeds the charging threshold, the push-pull output of the operational amplifier is brought to a low state (where a low-potential side transistor in a push-pull circuit inside the operational amplifier turns on to output a low level signal). This causes a discharged current from the capacitor to flow into a ground through a second feedback line, which slowly reduces the amount of charge in the capacitor. Along with this, part of a current from the voltage-dividing circuit flows into the ground through the output side of the operational amplifier. Thus the voltage level provided to the first input terminal of the operational amplifier falls below the charging threshold (the voltage level is hereinafter referred to as the "discharging threshold").

When the voltage level depending on the amount of charge in the capacitor falls below the discharging threshold, the push-pull output of the operational amplifier returns to a high level. Then the capacitor is again charged and the charging threshold is provided to the first input terminal of the operational amplifier.

In this way, the waveform of the output signal from the operational amplifier and/or the waveform of the voltage signal from the first input terminal side become square pulse waveforms so that they can be utilized as PWM signals.

With such an arrangement, the duty ratio of the PWM signal can easily be adjusted by only changing the resistance ratio between the second resistor and the third resistor, for example. Furthermore, if the circuit constant varies due to ambient temperature changes or the degradation of circuit elements, and thus the charging threshold and the discharging threshold vary, the charging time period and the discharging time period of the capacitor also vary accordingly. Consequently, the ratio between the charging time period and the discharging time period of the capacitor, or the duty ratio of the PWM signal, can be kept substantially constant.

The amount of the charging current of the capacitor varies linearly depending on the amount of charge. Therefore, in an arrangement in which a current determining the discharging threshold and the charging threshold, and a current charging/discharging the capacitor, flow through a common channel, the charging threshold and the discharging threshold would vary depending on the amount of charge even under the same environmental conditions. This would eventually pose a problem of variation in the duty ratio of the PWM signal. Instead, according to the instant arrangement, a current determining the discharging threshold and the charging threshold, and a current charging/discharging the capacitor, respectively flow through independent channels so that a PWM signal can be generated while the duty ratio is kept relatively constant.

<The Invention According to a Third Aspect>

The invention according to a first and second aspect of the invention includes an arrangement in which output signals from the comparator or the operational amplifier in the PWM signal generation circuit are outputted as PWM signals. In this arrangement, however, the PWM signal level may be affected by a current, which determines the charging threshold, flowing through the first resistor or the push-pull circuit in the operational amplifier. It is, therefore, more desirable to have an arrangement in which the voltage signal on the first input terminal side of the comparator or the operational amplifier is outputted as the PWM signal, such as an arrangement according to the second aspect of the invention.

<The Invention According to a Fourth Aspect>

In the case, for example, where a duty ratio of the PWM signal of, for example, 20% or less or 80% or more is desired, this may be achieved by changing the resistance ratio between the second resistor and the third resistor. However, use of a resistor of too large of a resistance may increase the susceptibility to temperature changes and the like. Therefore, according to the arrangement, charging of the capacitor is accomplished by allowing a current to flow from the power line through at least the second resistor, while discharging of the capacitor is accomplished through the third resistor.

<The Invention According to a Fifth Aspect>

According to the arrangement, there is provided a circuit element with the same temperature characteristics as a current regulating element for a current regulating means on the RC serial circuit. Therefore, even with temperature changes, the impact on the duty ratio of the PWM signal is minimized because the amount of the charging current and the amount of the discharging current vary in the same manner.

<The Invention According to a Sixth Aspect>

According to the arrangement, because the current regulating means and the circuit element are provided within the same chip, they will be equally affected by any ambient temperature changes. As a result, a PWM signal can be generated with a more precise duty ratio.

<The Invention According to a Seventh Aspect>

According to the arrangement, actuation and termination of PWM control can be easily switched by only turning on and off a switch means.

<The Invention According to an Eighth Aspect>

A semiconductor switch with an overheating protection function against overheating or an overcurrent may break itself down by repeated cycles of interruption and restoration. Particularly in an arrangement in which the semiconductor switch is supplied with PWM signals to turn on and off, the semiconductor switch may repeat interruption and restoration functions in response to the turning on and off operations. Therefore, according to the arrangement, an interruption detection means detects that an interruption has occurred in the semiconductor switch. Based on this, the PWM control is forced to be terminated by turning on and off the switch means in the PWM signal output control circuit.

BRIEF DESCRIPTION OF THE DRAWINGS

FIGS. 3(A) to 3(E) are timing charts illustrating signal waveforms at each point in operation.

DETAILED DESCRIPTION OF THE PREFERRED EMBODIMENTS

First Embodiment

A first embodiment of the invention will now be described with reference to FIGS. 1 to 3(A)-3(E).

A PWM control circuit 10 of the embodiment is for providing PWM control of a supply of power from a power supply 12 (e.g. a battery) to a pair of headlamps 13, 13 coupled to an output side of a thermal FET 11 by providing a PWM (Pulse Width Modulation) signal S1 as a control signal to an input of a thermal FET 11, which serves as a semiconductor switch, to turn the thermal FET 11 on and off.

Figure 1:
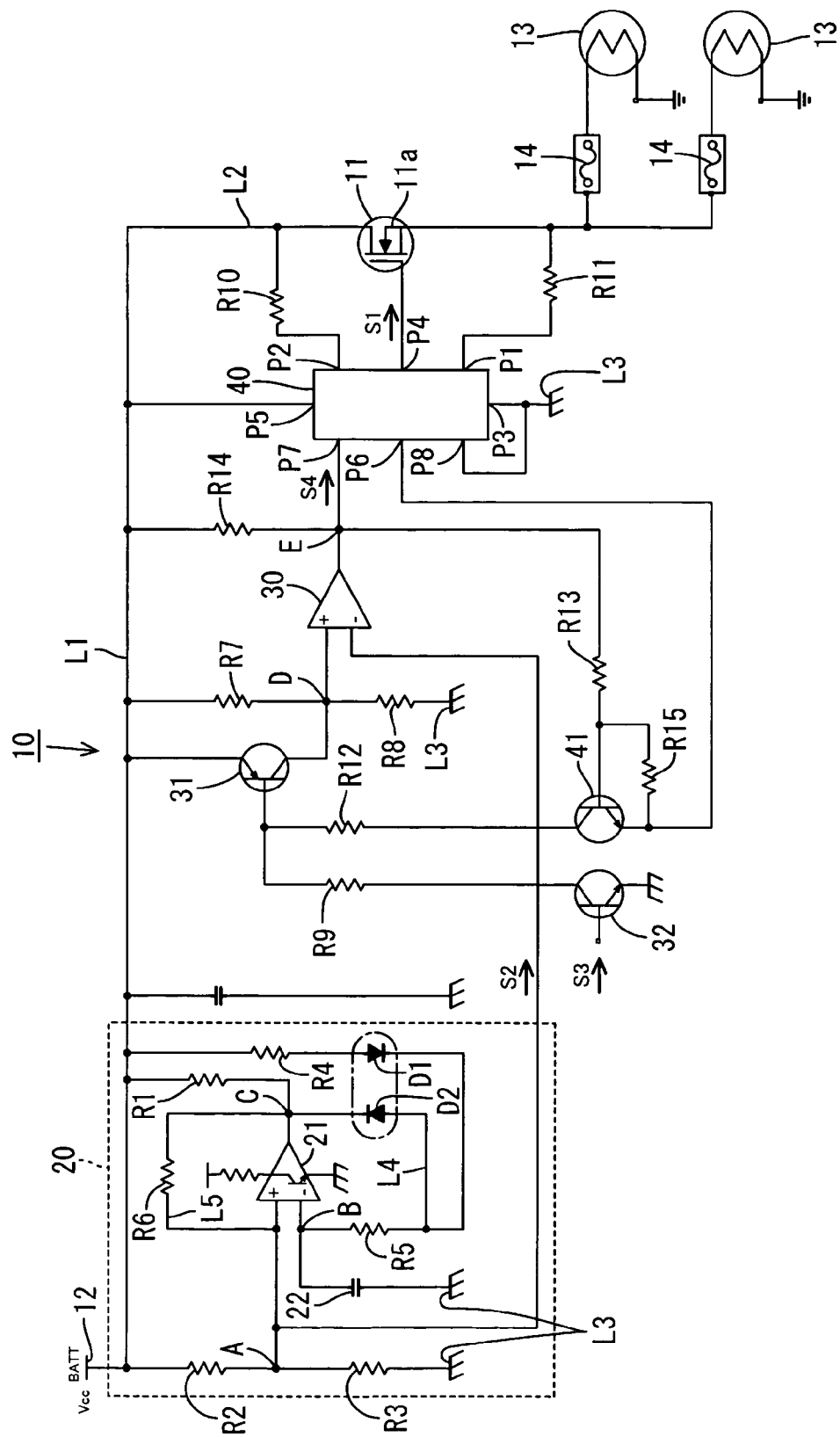
FIG. 1 is a circuit diagram of a PWM control circuit according to a first embodiment of the invention.

1. Configuration of the Embodiment (1) General Configuration of the PWM Control Circuit As shown in FIG. 1, the thermal FET 11 has a drain connected to a power line L1 coupled to a high-voltage side of the power supply 12, and a source respectively connected to the pair of headlamps 13, 13 through fuses 14, 14. The PWM control circuit 10 is arranged to cause a PWM signal generation circuit 20 to generate an output signal S2 as a PWM signal, and provide it to a gate of the thermal FET 11 to turn it on and off through a comparison circuit and the like.

(2) Internal Configuration of the Thermal FET

The thermal FET 11 has a well-known configuration with a overheating protection function. Although the thermal FET 11 is not described in detail, it is internally provided with a FET 11a, a thermal sensor as a means for sensing temperature, a control circuit, and a switch (FIG. 1 shows only the FET 11a among them). The FET 11a turns on and off in response to the PWM signal S1 inputted to the gate to control the amount of power supplied from the power supply 12 to the headlamps 13, 13. The thermal sensor detects the channel temperature of the FET 11a and outputs a detected temperature signal corresponding to the detected temperature. The control circuit is operative to receive the detected temperature signal from the thermal sensor. If the detected temperature exceeds a predetermined temperature, the control circuit determines that it is in an abnormal temperature condition and turns on the switch to short-circuit the source of the FET 11a to a ground level.

With the above configuration, the thermal FET 11 operates the overheating protection function by forcing the source potential to short-circuit to a ground level such that the supply of power to the headlamps 13, 13 is stopped when, for example, an overcurrent flows through a power supply line L2 coupled to the power supply 12 and the headlamps 13, 13 due to a short-circuit and the like in the headlamps 13, 13, exceeding a predetermined temperature. Subsequently, this stop operation reduces the channel temperature of the FET 11a below a predetermined temperature and causes the switch to turn on again to resume the supply of power to the headlamps 13, 13.

(3) PWM Signal Generation Circuit (a) Circuit Configuration

As shown in FIG. 1, a PWM signal generation circuit 20 comprises one comparator 21 (corresponding to "comparator" as used in the invention) of open-collector output type. An output side of the comparator 21 is connected to the power line L1 coupled to the power supply 12 through an output resistor R1. A pair of voltage-dividing resistors R2, R3, for example, are serially connected between the power line L1 and a ground line L3 (i.e., common line) coupled to a low-voltage side of the power supply 12, and a potential (divided voltage) on a connection point A thereof is provided to a positive input terminal (corresponding to "first input terminal" as used in the invention) of the comparator 21. In the embodiment, therefore, a "voltage-dividing circuit" of the invention is made up of a pair of voltage-dividing resistors R2, R3.

Similarly between the power line L1 and a ground line L3, a charging resistor R4, a diode D1, a charging/discharging resistor R5, and a capacitor 22 (i.e., corresponding to "capacitor" as used in the invention) are serially connected. A voltage across the terminals of the capacitor 22 is provided to a negative input terminal (corresponding to "second input terminal" as used in the invention) of the comparator 21. Here, the diode D1 has an anode side connected to the power line L1 side and the cathode side connected to the capacitor 22 side. The diode D1 serves to allow charging current to flow to the capacitor 22, while blocking the discharging current flow from the capacitor 22. The charging resistor R4 and the capacitor 22 correspond to an "RC serial circuit" as used in the invention.

An output of the comparator 21 is then positively fed back through a positive feedback resistor R6. The output of the comparator 21 is connected to the negative input terminal of the comparator 21 through a diode D2 and the charging/discharging resistor R5. Here, the diode D2 has an anode side connected to the capacitor 22 side and cathode side connected to the output side of the comparator 21. The diode D2 serves to block the charging current flow to the capacitor 22, while allowing discharging current to flow from the capacitor 22. The diode D1 and the diode D2 are integrated within the same chip.

Circuit operation of the PWM signal generation circuit 20 will now be described with reference to the circuit diagrams of FIGS. 2(A) and 2(B) and the timing charts shown in FIGS. 3(A) to 3(E).

(Charging)

Figure 2A:
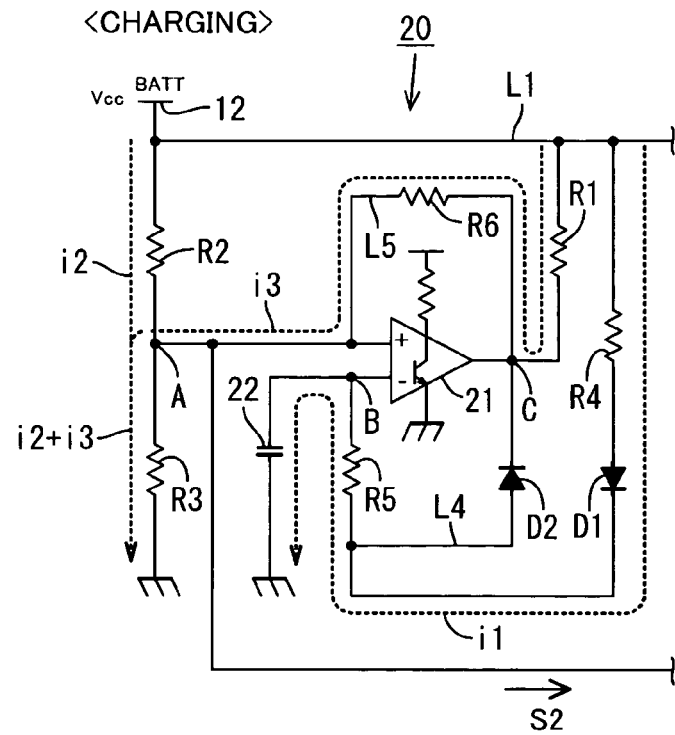
FIGS. 2(A) and 2(B) are diagrams illustrating a current flow in a PWM signal generation circuit.
Figure 2B:
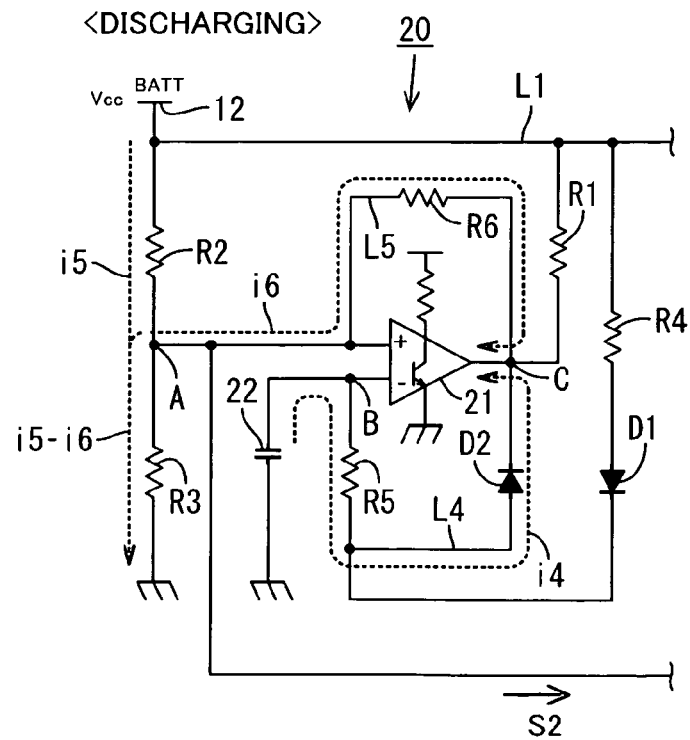

Upon powering the PWM control circuit 10, a current i1 flows from the power line L1 to the capacitor 22 through the charging resistor R4, the diode D1, and the charging/discharging resistor R5 to start charging, as shown in FIG. 2(A). Meanwhile, a current i2 flows from the power line L1 to the ground line L3 through the voltage-dividing resistors R2, R3, which constitute a voltage-dividing circuit, and a current i3 flows from the power line L1 to the ground line L3 through the output resistor R1, the positive feedback resistor R6, and the resistor R3. Therefore, a voltage level Va at the connection point A between the voltage-dividing resistors R2, R3 is determined at this time based on a power supply voltage Vcc, the voltage-dividing resistors R2, R3, the output resistor R1, and the positive feedback resistor R6. This voltage level is provided to the positive input terminal of the comparator 21 as a charging threshold TH1. As shown in FIG. 3, at the beginning of charging the capacitor 22, a voltage level Vb, at a connection point B between the negative input terminal of the comparator 21 and the capacitor 22, is still below the charging threshold TH1. Therefore the output of the comparator 21 is in a high state (that is, a "signal-blowing" state in which the open-collector circuit inside the comparator 21 turns off to bring a voltage level Vc to a high level at an output point C).

(Discharging)

When charging of the capacitor 22 continues and the voltage level Vb at the connection point B (i.e., the voltage across the terminals of the capacitor 22) exceeds the charging threshold TH1, the comparator 21 is inverted to a low state (that is, a "signal-drawing" state in which the open-collector circuit inside the comparator 21 turns on to bring a voltage level Vc to a low level at an output point C). This causes a current, which flowed from the power line L1 through the charging resistor R4 and the diode D1, to flow into the output point C (ground line L3) of the comparator 21 to stop the charging of the capacitor 22. Accordingly, as shown in FIG. 2(B), a discharging current i4 from the capacitor 22 flows into the output point C of the comparator 21 through the charging/discharging resistor R5 and the diode D2 (negative feedback line L4), in order to start discharging the capacitor 22.

Meanwhile, a current flowing from the power line L1 to the output resistor R1 flows into the output point C of the comparator 21. Accordingly, a current i5 passing through the resistor R2 from the power line L1 is divided into a current i6, which flows into the output point C of the comparator 21 through a positive feedback line L5, and a current i5-i6 which flows into the ground line L3 through the resistor R3. As shown in FIG. 3, this causes the voltage level Va at the connection point A between the voltage-dividing resistors R2, R3 to fall below the charging threshold TH1. This voltage level is provided to the positive input terminal of the comparator 21 as a discharging threshold TH2.

At the beginning of discharge from the capacitor 22, the voltage level Vb at the connection point B is still above the discharging threshold TH2, and the output of the comparator 21 is in a low state. When discharging of the capacitor 22 continues and the voltage level Vb at the connection point B falls below the discharging threshold TH2, the output of the comparator 21 returns to a high state, and the charging operation again takes over.

By repeating the above charging/discharging operations, the voltage level Vc at the output point C of the comparator 21 and the voltage level Va at the connection point A between the voltage-dividing resistors R2, R3 become pulse-shaped, respectively on/off signals, and thus PWM signals are generated. In the embodiment, a voltage signal S2 at the connection point A is used as a PWM signal. The duty ratio of the output signal S2 corresponds to the ratio of the charging operation time period to the discharging operation time period. This ratio can arbitrarily be determined by adjusting either the relationship of resistance values between the charging resistor R4 and the charging/discharging resistor R5, or each value of resistance of the output resistor R1, the voltage-dividing resistors R2, R3, and the positive feedback resistor R6, which determine each threshold TH1, TH2. In the embodiment, discharging time is adjusted to have a specific proportion in the range of 10 to 20% with respect to one cycle.

(4) Arrangement to Control Actuation and Termination of PWM Control

In the embodiment, circuits corresponding to a "comparison circuit" and a "PWM signal output control circuit," as used in the invention, are provided on subsequent stages of the PWM signal generation circuit 20.

Reference numeral 30 in FIG. 1 denotes a comparator corresponding to a comparison circuit as used in the invention. The output signal S2 from the PWM signal generation circuit 20 is provided to a negative input terminal thereof. A positive input terminal is adapted to be supplied with a voltage level Vd as a reference signal level at a connection point D of a pair of resistors R7, R8 serially connected between the power line L1 and the ground line L3. A transistor 31 is provided between the power line L1 and the connection point D as a switching means for turning on to short-circuit therebetween.

A base of the transistor 31 is connected to the ground line L3 through a resistor R9 and a transistor 32 as a switching means. With such an arrangement, when the transistor 32 is in an off state, the transistor 31 is also in an off state, and a divided voltage of a first level TH3, which is the power supply voltage Vcc divided by the resistor R7 and the resistor R8, is provided to a positive input terminal of the comparator 30. Here, the first level TH3 is set within the range of an amplitude (i.e., a voltage level between the high level and the low level) of the output signal S2.

Conversely, when the transistor 32 turns on with a control signal S3 provided to a base thereof, the transistor 31 also turns on to pull up the voltage level Vd at the connection point D to the power supply voltage Vcc side. This voltage level is provided to the positive input terminal of the comparator 30 as a second level TH4. Here, the second level TH4 is higher than the high level of the output signal S2. With such an arrangement, the resistors R7 to R9, and transistors 31, 32, function as a "PWM signal output control circuit" as used in the invention, as described below.

(5) Arrangement for Protecting the Thermal FET

As described above, continuous on and off cycling providing a PWM signal S1 to a thermal FET 11 with an overcurrent flowing through may cause the thermal FET 11 to be repeatedly interrupted and restored, resulting in a self-breakdown thereof. In the embodiment, therefore, an arrangement is provided to detect the interruption in the thermal FET 11 and, based on this detection, terminate the PWM control, that is, stop outputting the PWM signal.

Specifically, reference numeral 40 in FIG. 1 denotes a dual comparator, which is an IC containing a booster circuit for driving the N-channel FET 11a, and a fourth pin P4 for an output that is connected to the gate of the FET 11a. A second pin P2 is connected to the drain of the FET 11a through a resistor R10, and a first pin P1 is connected to the source of the FET 11a through a resistor R11. For power input, a fifth pin P5 is connected to the power line L1. A third pin P3 and an eighth pin P8 are connected for grounding to the ground line L3. A seventh pin P7 for an input is connected to an output point E of the comparator 30. As a status terminal, a sixth pin P6 is connected to the base of the transistor 31 through a transistor 41 and a resistor R12. In the transistor 41, the base is connected to the power line L1 through a resistor R13, a connection point E and a resistor R14, and an emitter and the base are connected through a resistor R15.

2. Operation of the Embodiment (1) Switching Between Headlighting in Daylight and Headlighting at Nighttime Upon powering the PWM control circuit 10 according to the invention from the power supply 12, the PWM generation circuit 20 starts outputting the pulse-shaped output signal S2, as described above. Here, for example, when headlights are turned on while driving during daylight (i.e., Daylights), a predetermined manipulation will prevent the control signal S3 from being provided to the transistors 32. At this time, as shown in the front half portion of FIG. 3(D), the voltage level Vd at the connection point D provided to the positive input terminal of the comparator 30 is at the first level TH3 within the range of the amplitude of the output signal S1. Therefore, as shown in the front half portion of FIG. 3(E), a voltage level Ve at the output point E of the comparator 30 has a pulse waveform obtained by a level inversion with respect to the output signal S2. This level-inverted output signal S4 is provided to the seventh pin P7 of the dual comparator 40, and also provided as-is to the gate of the FET 11a from the fourth pin P4 as the PWM signal S1. This provides headlighting during daylight (Daylights) where the headlights are illuminated at a brightness of approximately 10 to 20% of that in headlighting at nighttime described below.

On the other hand, when headlights are turned on while driving during nighttime, a predetermined manipulation causes the control signal S3 to be provided to the transistor 32. In contrast, this causes the voltage level Vd at the connection point D, provided to the positive input terminal of the comparator 30, to assume the second level TH4 which is higher than the high level of the output signal S1. Therefore, as shown in the rear half portion of FIG. 3(E), a voltage level Ve at the output point E of the comparator 30 is brought to a continuous high level. This continuous high level signal is provided to the gate of the FET 11a through the dual comparator 40. As a result, the FET 11a turns continuously on to switch to headlighting at nighttime, which is brighter than the headlighting during daylight with the PWM control.

(2) Operation for Protecting the Thermal FET

In headlighting during daylight described above, if an overcurrent flows through the thermal FET 11 and an interruption occurs, the dual comparator 40 detects the interrupting of the FET 11a based on the drain potential and the source potential of the FET 11*a*. Thereby, the dual comparator 40 switches the sixth pin P6 from a high level to a low level. This raises the base-emitter voltage across the transistor 41 above a predetermined value and turns on the transistor 41. This causes the transistor 31 to also turn on. Consequently, the voltage level Vd at the connection point D, provided to the positive input terminal of the comparator 30, is brought to a high level. As a result, the output from the comparator 30 is also brought to a continuous high level, as with the control signal S3 provided to the transistor 32 (i.e., headlighting at nighttime described above); switching to headlighting at nighttime (see the rear half portion of FIG. 3(D)). This prevents the thermal FET 11 from repeating a cycle of interruption and restoration under an overcurrent condition. Therefore, self-breakdown can be avoided.

3. Advantages of the Embodiment (1) According to the Arrangement of the embodiment, the duty ratio of the PWM signal S2 can easily be adjusted only by, for example, changing the resistance ratio between the charging resistor R4 and the charging/discharging resistor R5. Furthermore, if the circuit constantly varies due to ambient temperature changes or degradation of any circuit elements, and thus the charging threshold TH1 and the discharging threshold TH2 vary, the charging time period and the discharging time period of the capacitor 22 also vary accordingly. Consequently, the ratio between the charging time period and the discharging time period of the capacitor 22, or the duty ratio of the PWM signal S2, can be kept substantially constant.

According to the arrangement, a current determining the charging threshold TH1 and the discharging threshold TH2 and a current charging/discharging the capacitor 22 respectively flow through independent channels so that the PWM signal S2 can be generated with the duty ratio kept relatively constant. Furthermore, because such an arrangement can be realized using a single comparator 21, the circuits can be smaller.

(2) An arrangement can be envisaged in which an output signal from the comparator 21 in the PWM signal generation circuit 20 is outputted as a PWM signal. In this arrangement, however, the PWM signal level may be affected by a current flowing through the output resistor R1, which determines the charging threshold TH1. In the embodiment, therefore, an arrangement is adopted in which the voltage signal on the positive input terminal side of the comparator 21 is outputted as the PWM signal.

(3) In the embodiment, an arrangement is adopted in which the capacitor 22 is charged by a current flowing through the charging resistor R4 and the charging/discharging resistor R5 from the power line L1. The capacitor 22 is discharged only through the charging/discharging resistor R5. With such an arrangement, even if the duty ratio of the PWM signal S1 is desired on the order of 15 to 20%, the use of a resistor with a large resistance value can be avoided in order to alleviate the impact of temperature changes and the like.

(4) The arrangement has the diode Dl provided between the charging resistor R4 and the charging/discharging resistor R5. The diode Dl blocks a reverse flow of a discharged current from the capacitor 22 to the charging resistor R4 side.

(5) In addition, because the diode D1 and the diode D2 are provided within the same chip as the current regulating elements, they will be equally affected by any ambient temperature changes. Therefore, a PWM signal S2 can be generated with a more precise duty ratio.

(6) Actuation and termination of the PWM control, that is, headlighting during daylight (Daylights) and headlighting at nighttime, can easily be changed by only providing control signals to turn on and off the transistor 32.

(7) An arrangement is adopted in which, if an overcurrent flows through the thermal FET 11 and an interruption occurs, the dual comparator 40 detects the interruption, thereby causing the transistors 41, 31, to turn on, and an output signal from the comparator 30 is forced to change from the PWM signal to a constant level signal (i.e., a high level signal). Therefore, self-breakdown of the thermal FET 11 can be avoided.

Second Embodiment

Figure 4:
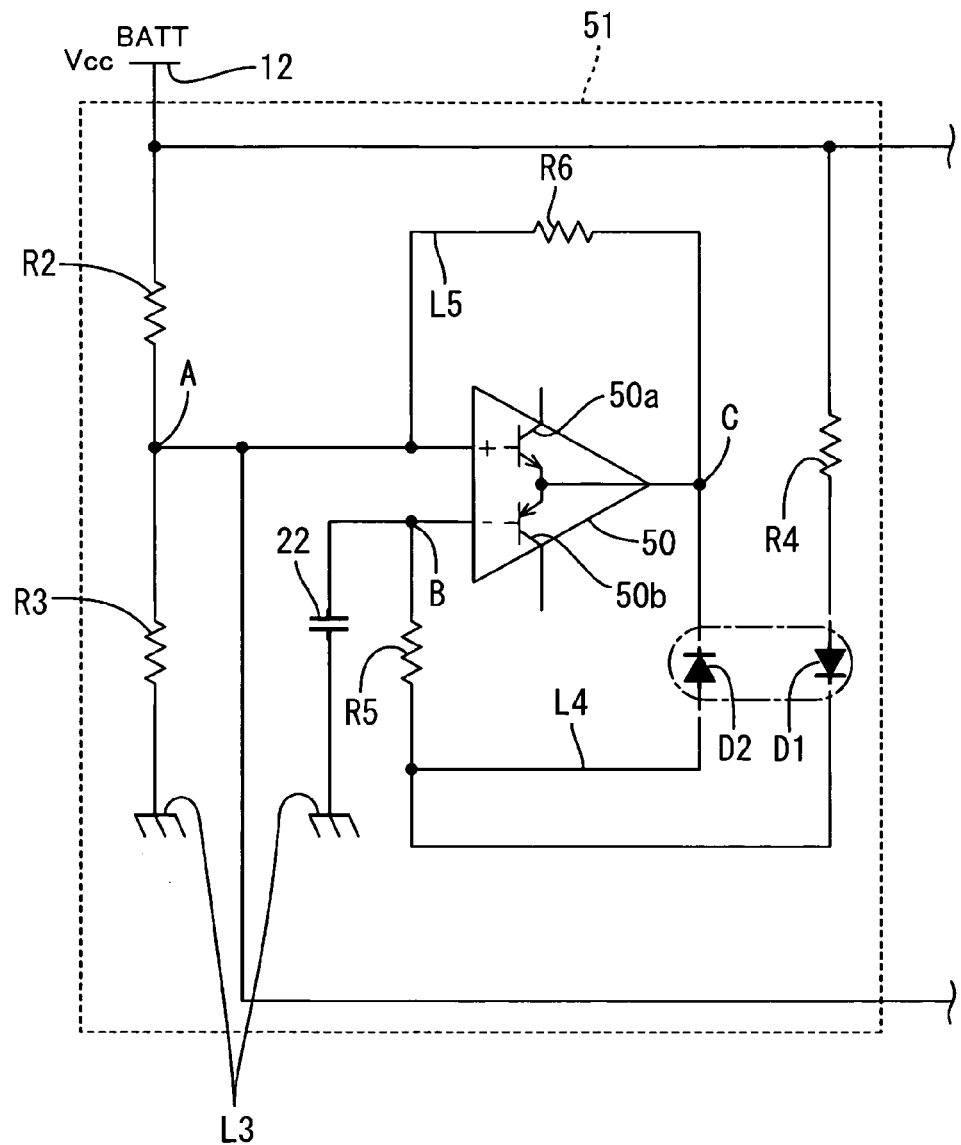
FIG. 4 is a circuit diagram of a PWM signal generation circuit according to a second embodiment.

FIG. 4 shows a second embodiment (corresponding to the invention according to a second aspect). The difference from the first embodiment primarily resides in the use of an operational amplifier 50 in place of the comparator 21. The other elements are similar to those of the first embodiment. Therefore, only the differences will be described, using the same reference numerals as in the first embodiment and omitting duplicated descriptions.

FIG. 4 is a circuit diagram illustrating a configuration of the second embodiment. FIG. 4 shows only the PWM signal generation circuit 51 portion of the PWM control circuit. As shown in FIG. 4, contrary to FIG. 1 for the first embodiment, the second embodiment adopts an arrangement in which an operational amplifier 50 is used in place of the comparator 21. In addition, the output resistor R1 is removed to omit a connection between an output of the operational amplifier 50 and the power line L1. The state in which a high-potential side transistor 50*a* of a push-pull circuit inside the operational amplifier 50 is turned on to output high level signals corresponds to the state in which the comparator 21 in the first embodiment is in a high state. Similarly, the state in which a low-potential side transistor 50*b* of a push-pull circuit inside of the operational amplifier 50 is turned on to output low level signals corresponds to the state in which the comparator 21 in the first embodiment is in a low state.

In this way, advantages equivalent to the first embodiment can be obtained with an arrangement having an operational amplifier 50 in place of the comparator 21.

Other Embodiments

The present invention is not limited to those embodiments described in the above description and the drawings and includes, for example, the following embodiments within the technical scope of the invention. The present invention can be practiced with various modifications other than those described below without departing from the scope of the subject matter.

(1) Although the headlamps 13, 13 are used as loads in each embodiment described above, the loads may be anything which requires PWM control. For example, the loads may be any lamp other than the headlamps, a drive motor for a power window, or a drive motor for a wiper, or a PWM heater.

Therefore, it is easy to adjust the duty ratio by changing the resistance values of the charging resistor R4 and the charging/discharging resistor R5.

(2) In each embodiment described above, although the charging resistor R4, corresponding to a second resistor, and the capacitor 22 are serially connected through the charging/discharging resistor R5 corresponding to a third resistor, they are not limited to this arrangement. Instead, they may be serially connected without passing through the charging/discharging resistor R5. Further, in this case, the charging/discharging resistor R5 on the line L4 may of course be arranged to be connected on the output point C side of the comparator 21 with respect to the diode D2, corresponding to a current regulating means. However, with the arrangement of the above embodiments, PWM signals for a very small or very large duty ratio can be generated without using a resistor having a large resistance value.

(3) In each embodiment described above, although the diode D1, corresponding to a circuit element, is provided for regulating the flow of the current discharged from the capacitor 22 to the charging resistor R4 side, an arrangement without this diode may be employed.

(4) In each embodiment described above, although the positive feedback resistor R6 is provided on the positive feedback line L5, an arrangement without the positive feedback resistor R6 may be employed.

(5) In each embodiment described above, although the "first input terminal" as used in the invention serves as the positive input terminal of the comparator 21 and the "second input terminal" as used in the invention serves as the negative input terminal of the comparator 21, the "first input terminal" as used in the invention may conversely serve as the negative input terminal of the comparator 21 and the "second input terminal" as used in the invention may serve as the positive input terminal of the comparator 21. Specifically, the positive input terminal of the comparator 21 is connected to the connection point B side and the negative input terminal is connected to the connection point A side relative to the arrangement of FIG. 1.

(6) In each embodiment described above, although the diode D1 is provided as a circuit element, the circuit element is not limited to this and may be any other element (such as a resistor) as long as they are circuit elements having the same temperature characteristics as the current regulating element (diode D2) connected to the line L4.

(7) In each embodiment described above, although the thermal FET 11, with an overheating protection function for interrupting when a predetermined temperature is reached, is used as a "semiconductor switch" as used in the invention, the semiconductor switch is not limited to this and may be any semiconductor switch with an overheating protection function for providing interruption, and detecting that the amount of current from the power supply to a load exceeds a predetermined value.

(8) The transistor 31, 32, and 41, may be any of a unipolar transistor and a bipolar transistor, including a TFT. The comparator 30 may be an operational amplifier.

What is claimed is:

1. PWM signal generation circuit for generating a PWM signal, comprising:
a comparator comprising:
a first input terminal,
a second input terminal, and
an output side of the comparator connected to a power line side through a first resistor;
a voltage-dividing circuit for providing a voltage signal to the first input terminal of the comparator,
wherein the voltage signal is obtained by dividing a first voltage between the power line and a ground line;
an RC serial circuit connected in parallel to the voltage-dividing circuit, the RC serial circuit comprising:
a second resistor disposed on the power line side, and
a capacitor disposed on the ground line side,
wherein the RC serial circuit provides a second voltage to the second input terminal of the comparator,
wherein the second voltage depends on an amount of charge in the capacitor;
a first feedback line for feeding back an output of the comparator to the first input terminal side; and
a second line that connects the output of the comparator to the second input terminal side through a diode and a third resistor,
wherein a discharged current from the capacitor flows into the output side of the comparator through the second line, and
wherein the diode blocks a current flow from the output side of the comparator toward the second input terminal.

2. The PWM signal generation circuit according to claim 1, wherein the voltage signal on the first input terminal side is outputted as the PWM signal.

3. The PWM signal generation circuit according to claim 1 wherein;
the third resistor is disposed on the second input terminal side with respect to the diode, and
the second resistor and the capacitor of the RC serial circuit are serially connected through the third resistor.

4. The PWM signal generation circuit according to claim 1, wherein the RC serial circuit further comprises a circuit element provided on a charging current path to the capacitor of the RC serial circuit,
wherein the circuit element has the same temperature resistance characteristics as the diode.

5. The PWM signal generation circuit according to claim 4, wherein the diode and the circuit element are provided within the same chip.

6. The PWM signal generation circuit according to claim 4, wherein the circuit element is a second diode.

7. A PWM control circuit comprising:
the PWM signal generation circuit according to claim 1;
a comparison circuit to which the PWM signal corresponding to the voltage signal on the first input terminal side of the PWM signal generation circuit is inputted,
wherein the comparison circuit outputs an output signal, and
wherein the output signal is inverted in response to a large-small comparison between a PWM signal level and a reference signal level; and
a PWM signal output control circuit comprising a switch,
wherein the PWM signal output control circuit switches the reference signal level between a first level in a range of an amplitude of the PWM signal and a second level outside of the range of the amplitude of the PWM signal in response to the switch turning on and off.

8. The PWM control circuit according to claim 7, comprising:
a semiconductor switch turning on and off based on the output signal outputted from the comparison circuit,
wherein the semiconductor switch has a protection function forcing an interruption of the semiconductor switch when a predetermined temperature or a predetermined amount of current is exceeded,
wherein the PWM control circuit controls a supply of power from a power supply coupled to the semiconductor switch to a load;

an interruption detection circuit for detecting an interruption of the semiconductor switch based on an output potential of the semiconductor switch; and
a PWM signal output stop circuit for forcing the reference signal level into the second level after the interruption is detected in the interruption detection circuit.

9. The PWM control circuit according to claim 7 further comprising:
a semiconductor switch turning on and off based on the output signal outputted from the comparison circuit,
wherein the PWM control circuit controls a supply of power from a power supply coupled to the semiconductor switch to a load,
wherein the load is at least one headlamp,
wherein the first level corresponds to a daylight lighting level, and
wherein the second level corresponds to a nighttime lighting level.

10. A PWM signal generation circuit for generating a PWM signal, comprising:
an operational amplifier comprising:
a first input terminal,
a second input terminal;
a voltage-dividing circuit for providing a voltage signal to the first input terminal of the operational amplifier,
wherein the voltage signal is obtained by dividing a first voltage between a power line and a ground line;
an RC serial circuit connected in parallel to the voltage-dividing circuit, the RC serial circuit comprising:
a second resistor disposed on the power line side, and
a capacitor disposed on the ground line side,
wherein the RC serial circuit provides a second voltage to the second input terminal of the operational amplifier,
wherein the second voltage depends on an amount of charge in the capacitor;
a first feedback line for feeding back an output of the operational amplifier to the first input terminal side; and
a second line that connects the output of the operational amplifier to the second input terminal side through a diode and a third resistor,
wherein a discharged current from the capacitor flows into the output side of the operational amplifier through the second line, and
wherein the diode blocks a current flow from the output side of the operational amplifier toward the second input terminal.

11. The PWM signal generation circuit according to claim 10 wherein the voltage signal on the first input terminal side is outputted as the PWM signal.

12. The PWM signal generation circuit according to claim 10 wherein;
the third resistor is disposed on the second input terminal side with respect to the diode, and
the second resistor and the capacitor of the RC serial circuit are serially connected through the third resistor.

13. The PWM signal generation circuit according to claim 10, wherein the RC serial circuit further comprises a circuit element provided on a charging current path to the capacitor of the RC serial circuit,
wherein the circuit element has the same temperature resistance characteristics as the diode.

14. The PWM signal generation circuit according to claim 13, wherein the diode and the circuit element are provided within the same chip.

15. The PWM signal generation circuit according to claim 13, wherein the circuit element is a second diode.

16. A PWM control circuit comprising:
the PWM signal generation circuit according to claim 10;
a comparison circuit to which the PWM signal corresponding to the voltage signal on the first input terminal side of the PWM signal generation circuit is inputted,
wherein the comparison circuit outputs an output signal, and
wherein the output signal is inverted in response to a large-small comparison between a PWM signal level and a reference signal level; and
a PWM signal output control circuit having a switch,
wherein the PWM signal output control circuit switches the reference signal level between a first level in a range of an amplitude of the PWM signal and a second level outside of the range of the amplitude of the PWM signal in response to the switch turning on and off.

17. The PWM control circuit according to claim 16, further comprising:
a semiconductor switch turning on and off based on the output signal outputted from the comparison circuit, the semiconductor switch having a protection function forcing an interruption of the semiconductor switch when a predetermined temperature or a predetermined amount of current is exceeded,
wherein the PWM control circuit controls a supply of power from a power supply coupled to the semiconductor switch to a load;
an interruption detection circuit for detecting interruption of the semiconductor switch based on an output potential of the semiconductor switch; and
a PWM signal output stop circuit for forcing the reference signal level into the second level after the interruption is detected in the interruption detection circuit.

18. The PWM control circuit according to claim 16, further comprising:
a semiconductor switch turning on and off based on the output signal outputted from the comparison circuit,
wherein the PWM control circuit controls a supply of power from a power supply coupled to the semiconductor switch to a load,
wherein the load is at least one headlamp,
wherein the first level corresponds to a daylight lighting level, and
wherein the second level corresponds to a nighttime lighting level.

19. A PWM control circuit, comprising:
a comparator comprising:
a first input terminal,
a second input terminal, and
an output side of the comparator,
wherein the output side of the comparator is connected to a power line side through a first resistor;
a voltage-dividing circuit for providing a voltage signal to the first input terminal of the comparator,
wherein the voltage signal is obtained by dividing a first voltage between the power line and a ground line;
an RC serial circuit connected in parallel to the voltage-dividing circuit, the RC serial circuit comprising:
a second resistor disposed on the power line side,
a capacitor disposed on the ground line side,
a second diode provided on a charging current path to the capacitor; and
wherein the RC serial circuit provides a second voltage to the second input terminal of the comparator, wherein the second voltage depends on an amount of charge in the capacitor;

a first feedback line for feeding back an output of the comparator to the first input terminal side; and a second line that connects the output of the comparator to the second input terminal side through a diode and a third resistor, wherein a discharged current from the capacitor flows into the output side of the comparator through the second line, and wherein the diode blocks a current flow from the output side of the comparator toward the second input terminal; and a PWM signal corresponding to the voltage signal on the first input terminal side, a comparison circuit to which the PWM signal is inputted, wherein the comparison circuit outputs an output signal, wherein the output signal is inverted in response to a large-small comparison between a PWM signal level and a reference signal level; and a PWM signal output control circuit comprising a switch, wherein the PWM signal output control circuit switches the reference signal level between a first level in a range of an amplitude of the PWM signal and a second level outside of the range of the amplitude of the PWM signal in response to the switch turning on and off, a semiconductor switch turning on and off based on the output signal outputted from the comparison circuit, wherein the PWM control circuit controls a supply of power from the semiconductor switch to a load.

20. The PWM control circuit according to claim 19, wherein the load is a heater.

\* \* \* \* \*